United States Patent [19]

Kwasnick et al.

[11] Patent Number: 5,132,539
[45] Date of Patent: Jul. 21, 1992

[54] PLANAR X-RAY IMAGER HAVING A MOISTURE-RESISTANT SEALING STRUCTURE

[75] Inventors: Robert F. Kwasnick; Donald E. Castleberry, both of Schenectady, N.Y.

[73] Assignee: General Electric Company, Schenectady, N.Y.

[21] Appl. No.: 751,849

[22] Filed: Aug. 29, 1991

[51] Int. Cl.⁵ .................................. G01T 1/20
[52] U.S. Cl. ........................ 250/361 R; 250/366; 250/368; 250/370.11
[58] Field of Search ............ 250/370.11, 361 R, 366, 250/368

[56] References Cited
FOREIGN PATENT DOCUMENTS
122988 7/1984 Japan .................... 250/370.11

Primary Examiner—Carolyn E. Fields
Attorney, Agent, or Firm—Donald S. Ingraham; James C. Davis, Jr.; Marvin Snyder

[57] ABSTRACT

A radiation imager comprises a scintillator mated to a photodetector array. An enclosure ring is disposed around the outer sidewalls of the scintillator and an enclosure ring cover hermetically bonded to the ring extends across the scintillator to form a chamber sealably enclosing the scintillator. The enclosure ring cover is substantially impervious to moisture, is radiation transmissive, and minimizes scattering of light from the scintillator. The cover may be optically reflective or light absorptive. The chamber is evacuated to draw the cover in towards the photodetector array and thus to ensure close contact between the cover and the scintillator and between the scintillator and the photodetector array. Desiccant can be disposed in the chamber to provide additional protection against moisture absorption by the scintillator.

23 Claims, 1 Drawing Sheet

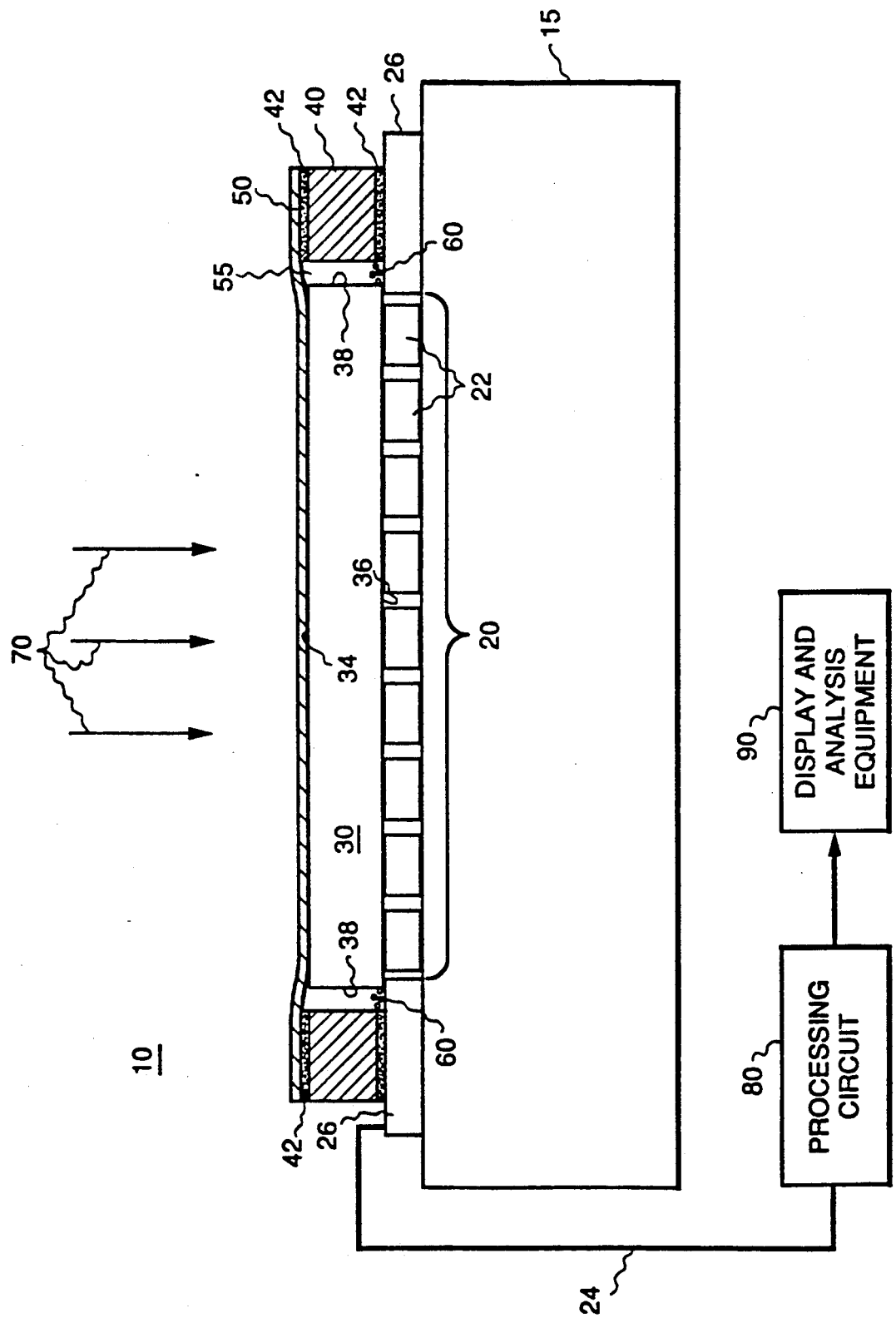

PLANAR X-RAY IMAGER HAVING A MOISTURE-RESISTANT SEALING STRUCTURE

RELATED APPLICATIONS AND PATENTS

This application is related to application Ser. No. 07/747,827, filed Aug. 21, 1991 and entitled "A Solid State Radiation Imager Having a Reflective and Protective Coating", By J. D. Kingsley, et al., which is assigned to General Electric Company and incorporated herein by reference.

1. Field of the Invention

This invention relates generally to radiation imaging systems and more particularly to scintillators coupled to photodectors for use in such systems.

2. Background of the Invention

Radiation imaging systems are widely used for medical and industrial purposes. Imaging systems have been developed which detect radiation and produce an electrical signal which in turn is used to operate a visual display device or other other equipment for analyses of the pattern of detected electromagnetic radiation. In such systems the radiation, which typically comprises x-ray or gamma rays, is absorbed in a scintillator material, resulting in the generation of photons of light. Light photons emanating from the scintillator are detected by photodetectors which generate an electrical output signal that can be processed to drive the display or analysis system.

The scintillator material may be in the form of a solid block or may be divided into separate elements, such as by dicing or cutting, or by depositing the scintillator material in such a manner that individual columns are formed. Regardless of the the structure of the scintillator, it is important to protect the scintillator material from moisture absorption. For example, cesium iodide, a common scintillator material, is a hygroscopic material, that is, it exhibits a tendency to absorb moisture from the atmosphere around it; in so doing it becomes hydrolyzed with a consequent degradation in its luminescent properties. In a radiation detector it is also beneficial to maximize the efficiency with which the luminescence from the scintillator is collected by the photodiodes by ensuring that the majority of photons generated in the absorption event are directed to the photodetectors.

Encasing scintillators within hermetically sealed enclosures to prevent moisture absorption has proven to be difficult due to the irregularly shaped ends or surfaces of the scintillator material, such as typically result from the common evaporative deposition processes used in formation of scintillators. Such irregular surfaces require that any hermetically sealing cover be attached to a stable structure other than the scintillator. Typical prior art imagers, such as the device of Derenzo disclosed in U.S. Pat. No. 4,672,207, do not suggest any sealing or reflective coating for the surfaces of the scintillator.

It is thus desirable to have an imager structure that: protects the scintillator from moisture present in the ambient atmosphere; allows transmission of incident radiation to the scintillator with a minimum of interference; does not adversely affect electrical performance of the imager; minimizes loss or scattering of light generated in the scintillator; and has a structure that is readily constructed and is effective and reliable.

It is accordingly an object of this invention to provide a protective hermetically sealing covering for the scintillator of an imager, which covering will serve as a barrier to inhibit absorption of moisture by the scintillator from the atmosphere surrounding the scintillator and which is substantially transparent to electromagnetic radiation of a predetermined wavelength.

It is another object of this invention to provide a protective covering that minimizes light loss and scattering from a scintillator. It is another object of this invention to provide a radiation imaging device of improved efficiency through use of a simple and reliable structure to provide a protective covering that is substantially impervious to moisture, is optically reflective, and that seals scintillator material from moisture in the surrounding atmosphere.

SUMMARY OF THE INVENTION

In accordance with the present invention, a radiation imaging device comprises a scintillator, an imaging array of photodetectors which is disposed on an imager substrate and which is optically coupled to the scintillator, a scintillator enclosure ring which is disposed around the active portion of the imager array and which surrounds the outer sidewalls of the scintillator, and an enclosure ring cover which is hermetically bonded to the enclosure ring and which extends over the surface of the scintillator through which the incident radiation enters. The enclosure ring and the cover form a chamber that is substantially impervious to moisture and which encloses the scintillator; the cover is radiation transmissive, and minimizes scattering of light away from the scintillator.

In a typical arrangement, the enclosure ring is bonded to the imager substrate with an epoxy or similar adhesive substance, which substance can also be used to bond the cover to the enclosure ring. The chamber formed by the enclosure ring and cover is evacuated, which draws the cover down towards the imager array, ensuring close contact between the cover and the scintillator and the scintillator and the imager array. The cover is advantageously comprised of a thin layer of aluminum foil; the aluminum can be optically reflective, which will cause light scattering from the scintillator to be reflected back into the scintillator, or alternatively it can be light absorptive.

BRIEF DESCRIPTION OF THE DRAWING

The features of the invention believed to be novel are set forth with particularity in the appended claims. The invention itself, however, both as to organization and method of operation, together with further objects and advantages thereof, may best be understood by reference to the following description in conjunction with the accompanying drawing in which:

The single FIGURE is a schematic cross sectional diagram of a radiation imaging device in accordance with this invention.

DETAILED DESCRIPTION OF THE PREFERRED EMBODIMENT

In the single FIGURE, a radiation imaging device 10 includes a photodetector array 20 disposed on a substrate 15, a scintillator 30 disposed adjacent to the photodetector array, an enclosure ring 40 disposed on the photodetector array so as to lie outside the active portion of the array and to surround the scintillator, and an enclosure ring cover 50 bonded to the enclosure ring and extending over scintillator 30. The photodetector array is coupled to a processing circuit 80, which processes the electrical signals for use in display and analysis equipment 90.

Photodetector array 20 comprises a plurality of photodetectors 22 arranged and electrically connected in a pattern, typically rows and columns. The photodetectors are disposed on imager substrate 15 to form an array that can be of any size and shape appropriate for the use of imaging device 10, such as for medical analyses of particular portions of the body. The photodetectors are advantageously photodiodes, and alternatively may comprise other known solid state photodetector devices. A connector 24 carries the electrical signals generated in the photodetectors to processing circuit 80.

Scintillator 30 is positioned adjacent to, and is optically coupled to, photodetector array 20. As used herein, "optically coupled to photodetector array 20" refers to arranging the two arrays so that light photons from the scintillator readily pass into photodetectors; the optical coupling may include a separate layer (not shown) of a material, such as an optical index matching substance, which aids in the efficient transfer of the photons from the scintillator to the photodetectors. As illustrated in the FIGURE, scintillator 30 comprises a substantially homogeneous block of scintillator material; alternatively, scintillator 30 may comprise a plurality of separate scintillator elements (not shown) diced, or cut, from a larger block of scintillator material or which may be separately grown or deposited in columnar structures using a known method such as vapor deposition or sputtering. Scintillator 30 may be grown or deposited directly onto photodetector array 20, or alternatively, may be deposited on a separate substrate, such as cover 50, and then aligned with and optically to coupled to photodetector array 20. The scintillator comprises a first end surface 34 through which incident x-ray or gamma radiation 70 enters the scintillator, and a second end surface 36, which is opposite to the first end or surface, through which the light photons pass to the adjoining photodetector array 20. Scintillator 30 further has outer sidewalls 38 extending between first end surface 34 and second end surface 36 around the outer edges of the scintillator. Cesium iodide is the material that is typically used to form scintillator 30, but the scintillator can alternatively comprise other known scintillating materials.

In accordance with the present invention enclosure ring 40 is disposed around the active portion of photodetector array 20 so as to surround scintillator outer sidewalls 38. As used herein, the "active portion of photodetector array 20" refers to that part of the array where the surfaces of the photodetectors that receive the light generated by the scintillators are situated; thus the enclosure ring may be attached to any suitable support structure around the photodetector array, such as contact fingers 26 or imager substrate 15, that is outside the area of the active portion of the array. Enclosure ring 40 is shaped to substantially surround or enclose the active portion of the array, and it is wide enough to provide the necessary structural strength to support the enclosure ring cover as described below. The height of enclosure ring 40 is sufficient to allow enclosure ring cover 50 to be suspended over, and preferably in contact with, scintillator first surface 34. For example, in a device which has an imager array with approximate boundary dimensions of 20×20 cm, the distance between the scintillator and the contact fingers of the imager array is sufficient to leave a gap between the enclosure ring and the scintillator while enclosure ring 40 advantageously has a width of about 2 mm and a height above the scintillator of about 0.4 mm.

Enclosure ring 40 advantageously comprises a material that has a coefficient of thermal expansion that is substantially the same as the thermal coefficient of expansion of imager substrate 15. The enclosure ring can thus be made of the same material from which the imager substrate is made, such as Corning 7059 glass, or from some metal material having a thermal coefficient of expansion compatible with the thermal coefficient of expansion of the substrate material, such as Kovar ®.

Enclosure ring 40 is advantageously bonded to the imager array with a moisture resistant adhesive 42 such as epoxy; alternatively other known adhesives such as acrylics or polyimides can be used. To avoid electrical short circuits when a ring material of a metal, such as Kovar, is used, the bonding material may be mixed with insulating beads having a diameter of approximately 10 microns which insulatively support the enclosure ring above photodetector array 20; alternatively, a polymer sheet with an adhesive on both sides can be used to bond the ring around the active portion of imager array 20.

Enclosure ring cover 50 is hermetically bonded to enclosure ring 40 and extends across scintillator first surface 34. Cover 50 is substantially impervious to moisture and is radiation transmissive. As used herein, "impervious to moisture" means that the cover forms a seal which prevents moisture in liquid or vapor form from passing through the cover; "radiation transmissive" refers to radiation of the type to be detected by the device and signifies that this radiation typically does not strongly interact with the material comprising the cover, thus allowing a maximum amount of the incident radiation to enter the scintillator without absorption or scattering.

Cover 50, when extended over scintillator 30 and bonded by adhesive 42 to enclosure ring 40, forms a chamber 55 sealably contains the scintillator within that volume; this sealed volume minimizes absorption of moisture by the scintillator from the atmosphere around the device. Cover 50 advantageously contacts or lies adjacent to first surface 34 of scintillator 30. "Contact" is used herein to mean in close proximity to the scintillator first surface 34, which may be uneven or irregularly shaped due to the deposition processes as described above, with portions of cover 50 touching scintillator first surface 34 but with substantially all of cover 50 being within about 10 μm of first surface 34; alternatively, scintillator 30 may be deposited directly onto cover 50.

Cover 50, while passing incident radiation, minimizes scattering of light away from the scintillator, that is, it substantially prevents light generated in the scintillator from exiting device 10 through scintillator first surface 34, and it also reduces the scattering of light between different areas of the scintillator. Cover 50 preferably comprises an optically reflective material, such as aluminum. Aluminum reflects visible light emerging from the scintillator back into the scintillator, thus improving the likelihood that light photons generated by the absorption of incident radiation in the scintillator will be detected by imaging array 20. Cover 50 also reflects light originating from outside of device 10. Alternatively, cover 50 may comprise a light absorptive material, such as black anodized aluminum or the like. A light absorptive cover would similarly prevent light from entering the scintillator from outside of the scintillator, and would substantially prevent light from scattering off of cover 50 into a portion or element of the scintillator from which it did not originate (such scattering would degrade the spatial resolution of the device 10).

The thickness of cover 50 is selected to provide sufficient mechanical strength so that it does not tear when extended over enclosure ring 40, but still has sufficient flexibility to be pulled or drawn into contact with scintillator first surface 34. The aluminum foil or sheeting comprising cover 50 typically has a thickness of about 1 mil.

A chamber 55 is formed by enclosure ring 40 and cover 50 and is advantageously evacuated to reduce pressure in the chamber to below the pressure outside the chamber. Evacuating the chamber tends to draw cover 50 inwardly as the higher ambient pressure outside of chamber 55 pushes cover 50 towards scintillator first surface 34.

A desiccant 60, such as a silica gel, may also advantageously be disposed in chamber 55 around scintillator 30 to provide further moisture protection for the scintillator. Desiccant 60 is typically in the form of a powder, with particles having diameters of about 100 μm.

In operation, device 10 is positioned to be in the path of incident radiation 70 that is of interest. The radiation, which may be x-rays, gamma rays, or other radiation detectable via the use of scintillators and photodetectors, passes through cover 50 into scintillator 30. When the radiation is absorbed in the scintillator, light photons are given off in more or less random directions. Light photons that emanate toward the first surface 34 of scintillator 30, or that are reflected in that direction after striking the walls of the scintillator, are prevented from scattering away from the device by cover 50; the light photons are either reflected back into the scintillator by optically reflective cover 50, or alternatively, if the cover comprises a light absorptive material, the light photons are absorbed. Light striking the active portion of the photodetector array causes the photodetectors to generate an electrical signal corresponding to the intensity of the incident radiation, which signal is processed by processing circuit 80. Display and analysis equipment 90 are responsive to signals generated by processing circuit 80.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A radiation imaging device comprising:
   a scintillator having a first and a second end surface, said first and second end surfaces being opposite one another such that radiation incident on said device enters said scintillator through said first end surface;
   a photodetector array comprising a plurality of photodetectors disposed on an imager substrate and forming an active portion of said photodetector array, said photodetector array being optically coupled to said second end surface of said scintillator to receive light therefrom;
   an enclosure ring disposed on said photodetector array around said active portion and surrounding the outer sidewalls of said scintillator; and
   an enclosure ring cover hermetically bonded to and suspended from said enclosure ring and extending across and in contact with portions of said first end surface of said scintillator, said cover being disposed to be in close non-conformal proximity to the scintillator first end surface so that said cover is within about 10 μm from the underlying scintillator first end surface, said cover being substantially impervious to moisture and radiation transmissive and disposed so as to substantially prevent scattering of light photons from said scintillator, said enclosure ring and said cover forming a chamber to sealably enclose said scintillator.

2. The device of claim 1 wherein said enclosure ring cover comprises an optically reflective material.

3. The device of claim 2 wherein said optically reflective enclosure ring comprises aluminum.

4. The device of claim 1 wherein said enclosure ring cover comprises a light absorptive material.

5. The device of claim 4 wherein said light absorptive enclosure ring cover comprises anodized aluminum.

6. The device of claim 1 wherein the thickness of said enclosure cover is about 1 mil.

7. The device of claim 1 wherein said enclosure ring has a coefficient of thermal expansion substantially the same as the coefficient to thermal expansion of said imager substrate.

8. The device of claim 7 wherein said enclosure ring comprises a metal material having a thermal coefficient of expansion compatible with said substrate thermal coefficient of expansion.

9. The device of claim 1 wherein said enclosure ring and said cover are hermetically bonded together with a material selected from the group consisting of epoxies, acrylics, and polyimides.

10. The device of claim 9 wherein said chamber enclosed by said enclosure ring and hermetically bonded cover is evacuated.

11. The device of claim 1 further including desiccant disposed within said chamber.

12. The device of claim 7 wherein said enclosure ring and said imager substrate are comprised of the same material.

13. The device of claim 1 wherein said scintillator comprises cesium iodide.

14. The device of claim 1 wherein said scintillator is disposed on said photodetector array.

15. The device of claim 1 wherein said scintillator is disposed on said enclosure ring cover.

16. A radiation imaging device comprising:
   a scintillator having a first and a second end surface, said first and second end surfaces being opposite one another such that radiation incident on said device enters said scintillator through said end first surface;
   a photodetector array comprising a plurality of photodetectors disposed on an imager substrate and forming an active portion of said photodetector array, said photodetector array being optically coupled to said second end surface of said scintillator to receive light therefrom;
   an enclosure ring, said ring being disposed on said photodetector array around said active portion and surrounding the outer sidewalls of said scintillator;

an enclosure ring cover hermetically bonded to and suspended from said enclosure ring and extending across and in contact with portions of said first end surface of said scintillator, said cover being disposed to be in close non-conformal proximity to the scintillator first end surface so that said cover is within about 10 μm from the underlying scintillator first end surface, said cover being substantially impervious to moisture and radiation transmissive and disposed so as to substantially prevent scattering of light photons from said scintillator, said enclosure ring and said cover forming a chamber to sealably enclosure said scintillator;

a processing circuit, said processing circuit being coupled to receive signals generated by said photodetector array; and display and analysis equipment, said equipment being coupled to, and responsive to, said processing unit.

17. The device of claim 16 wherein said enclosure ring cover is optically reflective.

18. The device of claim 17 wherein said optically reflective enclosure ring cover comprises aluminum.

19. The device of claim 16 wherein said enclosure ring cover is light absorptive.

20. The device of claim 16 wherein said enclosure ring has a coefficient of thermal expansion substantially the same as the coefficient of thermal expansion of said imager substrate.

21. The device of claim 16 wherein said chamber is evacuated.

22. The device of claim 16 further including desiccant disposed within said chamber.

23. The device of claim 16 wherein said scintillator comprises cesium iodide.

* * * * *